(12) United States Patent
Lamanna et al.

(10) Patent No.: US 8,089,307 B2
(45) Date of Patent: Jan. 3, 2012

(54) CHARGE TRANSFER IN A PHASE-LOCKED LOOP

(75) Inventors: Pasquale Lamanna, Villeneuve-Loubet (FR); Nicolas Sornin, La Tronche (FR)

(73) Assignee: Cambridge Silicon Radio Limited, Cambridge (GB)

( * ) Notice: Subject to any disclaimer, the term of this patent is extended or adjusted under 35 U.S.C. 154(b) by 0 days.

(21) Appl. No.: 12/918,786

(22) PCT Filed: Mar. 4, 2009

(86) PCT No.: PCT/EP2009/052561
§ 371 (c)(1),
(2), (4) Date: Sep. 24, 2010

(87) PCT Pub. No.: WO2009/109603
PCT Pub. Date: Sep. 11, 2009

(65) Prior Publication Data
US 2011/0025387 A1 Feb. 3, 2011

(30) Foreign Application Priority Data

Mar. 7, 2008 (GB) .................................. 0804342.4

(51) Int. Cl.
*H03L 7/06* (2006.01)
(52) U.S. Cl. ....................................... 327/157; 327/146
(58) Field of Classification Search .................. 327/146, 327/157
See application file for complete search history.

(56) References Cited

U.S. PATENT DOCUMENTS 5,208,546 A * 5/1993 Nagaraj et al. ................. 327/157

(Continued)

FOREIGN PATENT DOCUMENTS

WO 02/076009 A1 9/2002

OTHER PUBLICATIONS

Meninger et al., "A 1-MHz Bandwidth 3.6-GHz 0.18-um CMOS Fractional-N Synthesizer Utilizing a Hybrid PFD/DAC Structure for Reduced Broadband Phase Noise," IEEE Journal of Solid-State Circuits, Apr. 2006, pp. 966-980, vol. 41, No. 4, IEEE.

(Continued)

*Primary Examiner* — Lincoln Donovan
*Assistant Examiner* — Adam Houston
(74) *Attorney, Agent, or Firm* — Novak Druce DeLuca + Quigg LLP

(57) ABSTRACT

A phase-locked loop arranged to generate an output signal having a first frequency that is a static value times the frequency of a reference signal, the phase-locked loop comprising a signal generator arranged to generate the output signal, a divider arranged to receive the output signal and divide the output signal to form a feedback signal, the divider being arranged to vary the divisor by which the output signal is divided to cause the output signal to have a frequency that is said static value times the frequency of the reference signal, a comparison unit arranged to compare the feedback signal with the reference signal, one or more current generators arranged to output current pulses in dependence on said comparison, a summation unit arranged to receive the current pulses output by the current generator(s) and form a single current pulse therefrom and a loop filter arranged to filter the single current pulse to form a control signal for controlling the signal generator, the phase-locked loop being arranged such that the current generator(s) generate(s) a first current pulse dependent on a phase-difference between the feedback signal and the reference signal and a second current pulse whose magnitude and sign are dependent on an error in the feedback signal that is caused by the variation of the divisor, and the summation unit receives the first and second current pulses and stores an electrical charge representative of those current pulses and the summation unit outputs a single current pulse dependent on the electrical charge stored by the summation unit, said single current pulse being representative of a phase-difference that would have existed between the reference signal and the feedback signal if the feedback signal had been formed by dividing the output signal by said static value and not by the varied divisor.

15 Claims, 7 Drawing Sheets

U.S. PATENT DOCUMENTS

| | | | |
|---|---|---|---|
| 5,521,948 A | 5/1996 | Takeuchi | |
| 6,100,767 A * | 8/2000 | Sumi | 331/11 |
| 6,147,561 A * | 11/2000 | Rhee et al. | 331/12 |
| 6,509,800 B2 * | 1/2003 | Stockton | 331/11 |
| 6,603,360 B2 * | 8/2003 | Kim et al. | 331/1 A |
| 6,806,742 B1 | 10/2004 | Briones et al. | |
| 6,952,125 B2 * | 10/2005 | Ahn et al. | 327/156 |
| 7,298,218 B2 * | 11/2007 | Ghazali et al. | 331/16 |
| 7,352,249 B2 * | 4/2008 | Balboni et al. | 331/16 |
| 7,436,227 B2 * | 10/2008 | Thomsen et al. | 327/147 |
| 7,496,169 B2 * | 2/2009 | Kanehachi et al. | 375/376 |
| 7,512,205 B1 * | 3/2009 | Erol | 375/376 |
| 7,813,065 B2 * | 10/2010 | Annampedu et al. | 360/29 |
| 7,825,708 B2 * | 11/2010 | Thomsen et al. | 327/156 |
| 8,014,099 B2 * | 9/2011 | Mathew et al. | 360/75 |
| 2002/0075091 A1 | 6/2002 | Lo et al. | |
| 2002/0136342 A1 * | 9/2002 | Lee et al. | 375/376 |
| 2004/0085103 A1 * | 5/2004 | Ahn et al. | 327/156 |
| 2004/0207437 A1 * | 10/2004 | Shibahara et al. | 327/156 |
| 2004/0232960 A1 | 11/2004 | Albasini et al. | |
| 2005/0094757 A1 | 5/2005 | Meninger et al. | |
| 2005/0248413 A1 | 11/2005 | Zhu et al. | |
| 2007/0126512 A1 | 6/2007 | Bellaouar et al. | |
| 2011/0025387 A1 * | 2/2011 | Lamanna et al. | 327/157 |
| 2011/0025388 A1 * | 2/2011 | Lamanna et al. | 327/157 |
| 2011/0193601 A1 * | 8/2011 | Albasini et al. | 327/156 |

OTHER PUBLICATIONS

Koo et al., "A Fully Integrated CMOS Frequency Synthesizer With Charge-Averaging Charge Pump and Dual-Path Loop Filter for PCS- and Cellular-CDMA Wireless Systems," IEEE Journal of Solid-State Circuits, May 2002, pp. 536-542, vol. 37, No. 5, IEEE.

Cassia et al, "Analytical Model and Behavioral Simulation Approach for a Pi Delta Fractional-N Synthesizer Employing a Sample-Hold Element," IEEE Transactions on Circuits and Systems—II: Analog and Digital Signal Processing, Nov. 2003, pp. 850-859, vol. 50, No. 11, IEEE.

* cited by examiner

CHARGE TRANSFER IN A PHASE-LOCKED LOOP

A phase-locked loop is a circuit that generates an output signal having a predetermined frequency and/or phase relationship with a reference signal. A typical phase-locked loop is shown in FIG. 1. The phase-locked loop comprises an oscillator 101 for generating a signal of fixed frequency and a phase/frequency detector (PFD) for comparing the fixed frequency signal (the reference signal) with a feedback signal output by a divider 107 that is located in feedback loop 106. The PFD is connected to a charge pump 103. The PFD outputs a signal to the charge pump that is representative of the phase and/or frequency difference between the feedback signal and the reference signal. The charge pump injects a current into a loop filter 104 in dependence on the signal it receives from the PFD. Typically, this current injection will take the form of either an "up" or "down" current generated by current sources 108 and 109 respectively, so that current flows either into or out of the loop filter. In other words, the PFD and charge pump act together to output either positive or negative charge "pulses" in dependence on whether the reference signal's phase leads or lags the feedback signal. The loop filter filters these charge pulses to generate a control signal for a signal generator 105.

The signal generator is typically a voltage-controlled oscillator (VCO) controlled by a tuning voltage at its control input. The loop filter is typically arranged to integrate the current pulses it receives from the charge pump to generate the tuning voltage necessary for controlling the VCO. If the feedback signal lags the reference signal, it is necessary to speed up the VCO. Conversely, if the feedback signal leads the reference signal, it is necessary to slow down the VCO.

The frequency of the signal output by the phase-locked loop can be changed by varying the frequency of the reference signal. Often, the reference signal is generated by a very stable oscillator whose frequency cannot be varied. Therefore, it can be beneficial to include a divider in the feedback loop so that the output frequency of the phase-locked loop can be varied without having to change the frequency of the reference signal. In FIG. 1, this divider is shown at 107. If the divide ratio is a constant N, then the loop forces the output signal to be exactly N times the reference signal frequency. In circuits of this type the divide ratio N can be changed in integer steps to change the frequency of the signal generator.

One limitation with this type of phase-locked loop is that the output frequency cannot be varied in steps any smaller than the reference frequency. This is because N can only have integer values, so that the smallest change in the output frequency that can be made is $1 \times F_{REF}$. Therefore, for fine frequency resolution, it is preferred to have a small reference frequency. However, due to mismatches in the phase-locked loop's charge pump and other factors such as the non-ideal behaviour of the PFDs, the charge pump tends to output small charge pulses that cause sidebands to appear in the output signal of the VCO, even when the phase-locked loop is locked. These sidebands appear at offsets equal to the reference frequency. Therefore, if the reference frequency is small, a narrower loop filter bandwidth is required to remove the sidebands. Phase-locked loops with narrower loop filter bandwidths take longer to transition from one frequency to another and may not operate at the required speed. Also, the narrower the loop filter's bandwidth, the less the VCO's phase noise is suppressed.

One way of achieving a lower reference frequency for an integer PLL is to put a 1/M divider between the reference signal and the PFD. Another solution is to use a fractional-N divider. Fractional-N synthesis involves varying the division ratio periodically between two integer values, as shown in FIG. 2. The overall division ratio is then determined by N plus a fractional value determined by the time for which a division ratio of N+1 is used relative to a whole time period (i.e. the time for which a division ratio of N is used plus the time for which a division ratio of N+1 is used).

A problem with a fractional-N division architecture is that the modulation of the division ratio causes a huge transient voltage at the input to the VCO. To partially compensate for this effect, DAC compensation can be performed in parallel with the charge pump output. An example of a circuit using DAC compensation is shown in FIG. 3. FIG. 3 illustrates the PFD charge pump 301, the DAC charge pump 302, the loop filter 303 and the VCO 304. The deterministic jitter caused by the modulation of the division ratio is known in advance. The DAC charge pump typically generates a current that is the inverse of the error current caused by the modulation of the division ratio. This is then summed by the loop filter with the current output by the PAD charge pump.

The PFD charge pump outputs a constant current for a length of time that is dependent on the phase difference between the feedback signal and the reference signal, while the DAC charge pump outputs a current for a constant time but with a magnitude that is dependent on the deterministic jitter resulting from the modulation of the division ratio. Therefore, although by summing these two currents together in the loop filter it can be ensured that on average the amount of charge introduced into the system by deterministic jitter is compensated for, it does not suppress the transients that are an inherent part of the structure.

Therefore, there is a need for an improved phase-locked loop that does not suffer from transients resulting from temporal mismatch between the current pulses generated by the PFD and DAC charge pumps.

According to an embodiment of the invention, there is provided a phase-locked loop arranged to generate an output signal having a first frequency that is a static value times the frequency of a reference signal, the phase-locked loop comprising a signal generator arranged to generate the output signal, a divider arranged to receive the output signal and divide the output signal to form a feedback signal, the divider being arranged to vary the divisor by which the output signal is divided to cause the output signal to have a frequency that is said static value times the frequency of the reference signal, a comparison unit arranged to compare the feedback signal with the reference signal, one or more current generators arranged to output current pulses in dependence on said comparison, a summation unit arranged to receive the current pulses output by the current generator(s) and form a single current pulse therefrom and a loop filter arranged to filter the single current pulse to form a control signal for controlling the signal generator, the phase-locked loop being arranged such that the current generator(s) generate(s) a first current pulse dependent on a phase-difference between the feedback signal and the reference signal and a second current pulse dependent on an error in the feedback signal that is caused by the variation of the divisor, and the summation unit receives the first and second current pulses and stores an electrical charge representative of those current pulses and the summation unit outputs a single current pulse dependent on the electrical charge stored by the summation unit, said single current pulse being representative of a phase-difference that would have existed between the reference signal and the feedback signal if the feedback signal had been formed by dividing the output signal by said static value and not by the varied divisor.

The phase-locked loop may be arranged such that the current generator(s) generates the first current pulse to have a fixed value and a duration that is dependent on the phase-difference between the feedback signal and the reference signal.

The phase-locked loop may be arranged such that the current generator(s) generates the second current pulse to have a predetermined duration and a value that is dependent on the error in the feedback signal caused by the variation of the divisor.

The summation unit may be arranged to form the single current pulse by discharging the electrical charge stored by the summation unit.

The summation unit may comprise a capacitive element arranged to store an electrical charge representative of the magnitude and duration of the first current pulse.

The summation unit may comprise a capacitive element arranged to store an electrical charge representative of the magnitude and duration of the second current pulse.

The phase-locked loop may be arranged such that, during a first time period, the current generator(s) generate the current pulses and the summation unit stores the electrical charge, and during a second time period, the summation unit outputs the single current pulse, wherein the first and second time periods do not overlap.

The summation unit may be capable of causing a current to flow either into or out of the loop filter in dependence on the first and second currents, the summation unit comprising two current paths, the first current path being for generating a current in one direction at an input node of the loop filter and the second current path being for generating a current in the opposite direction at the input node of the loop filter.

The summation unit may comprise a capacitive element having first and second capacitive plates and a switching arrangement arranged such that, during a first time period, the first and second capacitive plates are each in communication with a respective one of the current paths, whereby a current output by the first current path causes an electrical charge to be formed on the first capacitive plate and a current output by the second current path causes an electrical charge to be formed on the second capacitive plate, and during a second time period, the first and second capacitive plates are connected to a reference voltage and the input node of the loop filter respectively, the electrical charge formed on the first and second capacitive plates during the first time period thereby being discharged to form a the single current pulse.

The capacitive element may be arranged such that the electrical charge formed on the first capacitive plate discharges in one direction relative to the input node of the loop filter and the electrical charge formed on the second capacitive plate discharges in the opposite direction relative to the input node of the loop filter.

The capacitive element may be connected between the first and second current paths such that, during the first time period, a current output by the first current path causes a voltage change at the other of the switched nodes of the current control device of the first path that causes an electrical charge to form on the first capacitive plate and a current output by the second current path causes a voltage change at the other of the switched nodes of the current control device of the second path that causes an electrical charge to form on the second capacitive plate.

The capacitive element may be a capacitor arranged such that, during the first time period, one plate of the capacitor is connected to the first current path and the other plate of the capacitor is connected to the second current path.

The capacitive element may comprise two capacitive devices, one connected to the first current path and the other connected to the second current path such that, when a current is output by one of the current paths, it is received by the capacitive device connected to that current path and causes an electrical charge to form on a plate of that device.

The capacitive element may comprise a switch arranged such that, during the first time period, the capacitive devices are not connected to each other and, during the second time period, the capacitive devices are connected to each other.

The capacitive devices may be capacitors.

The static value may be a non-integer.

The single current pulse may provide a charge that is a function of the phase-difference that would have existed between the reference signal and the feedback signal if the feedback signal had been formed by dividing the output signal by said static value and not by the varied divisor.

The single current pulse may provide a charge that is proportional to the phase-difference that would have existed between the reference signal and the feedback signal if the feedback signal had been formed by dividing the output signal by said static value and not by the varied divisor.

For a better understanding of the present invention, reference is made by way of example to the following drawings, in which.

Figure 1:
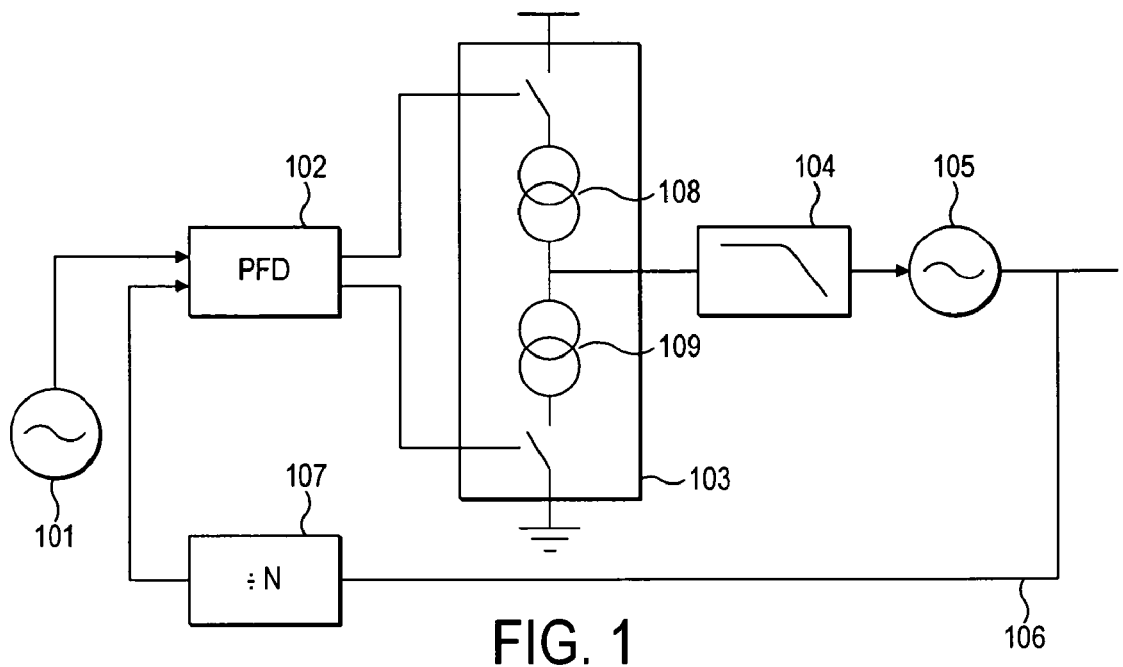
FIG. 1 shows a phase-locked loop.
Figure 2:
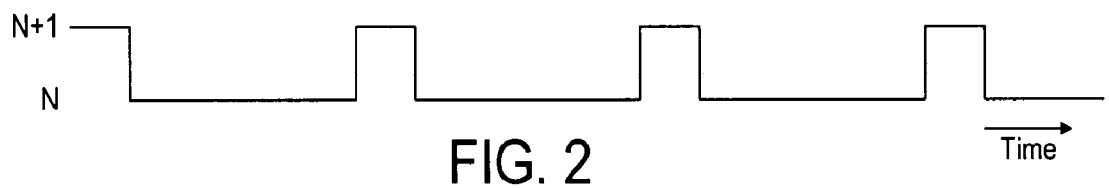
FIG. 2 shows the modulation of a division ratio for fractional-N division.
Figure 3:
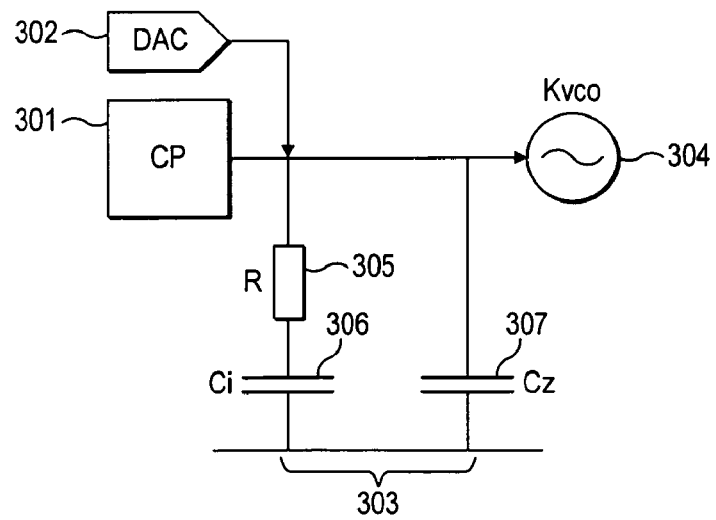
FIG. 3 shows a phase-locked loop incorporating DAC compensation.

A phase-locked loop may generate an output signal having a frequency that is a static multiple of the frequency of a reference signal. The output signal therefore has a frequency that is a multiple of the reference frequency. This multiple may be able to be changed, so that the phase-locked loop is capable of generating output signals having different frequencies. When the multiple has a static value the phase-locked loop may be capable of entering a "locked" condition in which the output signal constantly has a frequency that is the required multiple of the reference frequency.

The phase-locked loop may comprise a signal generator arranged to generate the output signal. The phase-locked loop may also incorporate a feedback loop so that the signal output by the signal generator can be fed back and compared with the reference signal. The feedback loop may include a divider that is arranged to receive the output signal and divide the output signal to form the feedback signal. The divider may be arranged to vary the divisor by which the output signal is divided. The divisor may be a fractional-N divisor and the static value may be a non-integer, e.g. the output frequency may be a fractional multiple of the reference frequency. The divisor may take one of two or more integer values.

The phase-locked loop may comprise a comparison unit arranged to compare the feedback signal with the reference signal and one or more current generators arranged to output a current in dependence on said comparison. The phase-locked loop may also comprise a summation unit arranged to receive the currents output by the current generator(s) and form a single current pulse from those current pulses. Finally, the loop filter may comprise a loop filter arranged to filter the single current pulse to form a control signal for controlling the signal generator.

The current generator(s) may generate a first current pulse dependent on a phase-difference between the feedback signal and the reference signal and a second current pulse dependent on an error in the feedback signal that is caused by the variation of the divisor. The summation unit may receive the first and second current pulses and store an electrical charge representative of those current pulses. The summation unit may then output a single current pulse dependent on the electrical charge stored by the summation unit during the first time period. This single current pulse is suitably representative of a phase-difference that would have existed between the reference signal and the feedback signal if the feedback signal had been formed by dividing the output signal by the static value and not by the varied divisor. The single current pulse may provide a charge that is a function of the phase-difference that would have existed between the reference signal and the feedback signal if the feedback signal had been formed by dividing the output signal by the static value and not by the varied divisor, e.g. the charge provided by the single current pulse may be proportional to that phase-difference.

A phase-locked loop as described above is shown in FIG. 4. The phase-locked loop comprises a comparison unit 402 that is arranged to receive a reference signal 401 and compare it with a feedback signal output by a divider 407. The comparison unit may determine a phase-difference between the reference signal and the feedback signal from this comparison. For example, the comparison unit may determine a time difference between the points at which both signals rise above a predetermined threshold. The comparison unit may also receive information from the divider indicating how the division ratio is being varied.

The divider in the feedback path allows the phase-locked loop to form an output signal 409 having a frequency that is a multiple of the reference signal. This can be achieved by the divider simply dividing the output signal by the multiplier. However, it can be advantageous in some circumstances for the divider to vary the division ratio so that, although the average value of the divisor is equal to the multiplier, the divisor used by the divider at any given time instant may be greater than or less than the multiplier. One advantage of varying the divisor in this way is that it enables fractional division of the reference signal to be achieved, so that the output signal is not limited to having a frequency that is an integer multiple of the frequency of the reference signal.

Varying the divisor means that at any given time instant the feedback signal may have a frequency that is slightly too high (because the divisor is below the static value) or slightly too low (because the divisor is above the static value). The phase-difference detected by the comparison unit by comparing the feedback signal with the reference signal may therefore be slightly smaller or larger than it should be. The comparison unit may use information about the modulation of the division ratio to determine this phase-error in the feedback signal.

The comparison unit may comprise one or more phase-frequency detectors for controlling the charge pump to generate current pulses in response to the phase-difference and the phase-error. One PFD could perform both functions. However, it may be beneficial to have two PFDs so that one can continuously monitor the reference and feedback signals. This may address problems with dead-zones that would otherwise occur.

The information that the divider provides to the comparison unit may be an overflow from a counter used to control the value of the divisor. Alternatively, the information could be provided by the output of sigma-delta modulator used to control the value of the divisor. The stream of ones and zeros output by the sigma-delta modulator may be used to control when the divisor is changed between integer values. This stream of ones and zeros is representative of the phase-error and may be passed through a further sigma-delta modulator for noise shaping purposes before being passed to the comparison unit.

The comparison unit may control two current generators 403, 404 to output current pulses in dependence on the determined phase-difference and phase-error. Typically, one current generator may generate the current pulse responsive to the phase-difference between the feedback signal and the reference signal and the other current generator may generate the current pulse responsive to the phase-error in the feedback signal due to modulation of the division ratio. The phase-locked loop may however include more or fewer current generators. Some of the specific implementations described in detail below use only one charge pump to generate both types of current pulse.

The summation unit 405 receives the current pulses and performs a summation process so that the single current pulse output by the summation unit is representative of the actual phase error in the output signal. The summation unit may store the charge contained in the current pulses received from the current generators during the first time period and output a single current pulse containing all or some of this stored charge during the second time period. The single current pulse may contain the sum of, or the difference between, the electrical charge contained in the two current pulses that were received from the current generators.

Theoretically, if the phase-locked loop is in the locked condition, the charge contained in the current pulses output by the current generators should be equal and opposite, so that they sum to zero. This is because in the locked state, the output signal should have a frequency that is the static value times the frequency of the reference signal, so that the phase-difference between the feedback signal and the reference signal is solely due to the variation of the divisor. In practice some differences between the charge contained in the two current pulses may still exist in the locked state. However, these differences can be made very small by increasing the precision of the phase-error compensation (i.e. the compensation that accounts for the variation of the divisor).

The single current pulse generated by the summation unit is received by an input node of the loop filter 406. The loop filter filters the single current pulse to form a control signal for the signal generator 408, which may be a voltage controlled oscillator (VCO).

The summation unit therefore provides the loop filter with a single current pulse that is indicative of the actual phase error in the output signal relative to the reference signal. This may reduce problematic transients which would otherwise be introduced into the loop filter, particularly when there is a temporal mismatch between the various current pulses that may be generated responsive to phase errors in the output signal.

Figure 8:
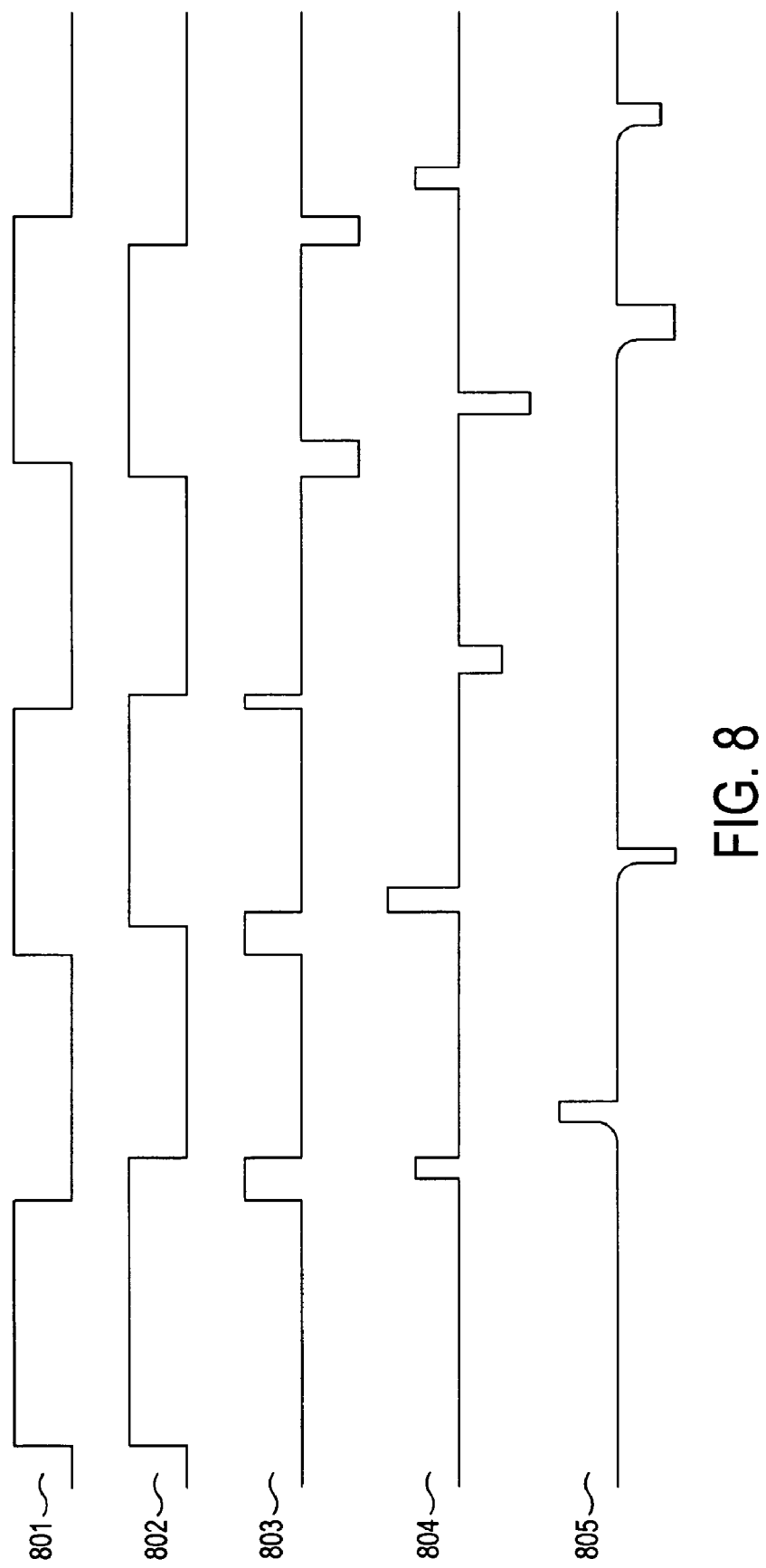
FIG. 8 shows a timing diagram of signals in a phase-locked loop.

Examples of signals that may be involved in the operation of the phase-locked loop are shown in FIG. 8. A reference signal is shown at 801. A feedback signal is shown at 802. The reference signal initially lags the reference signal, causing one of the current generators to generate current pulses in the "up" direction because the VCO needs to be speeded up (first current pulses 803). After some time, the VCO has been speeded-up too much and feedback signal starts to lead the reference signal. This causes the first current pulses change direction to become "down" pulses, which are intended to cause the VCO to slow down.

Each of the first current pulses has the same current value but varies in duration dependent on the phase-difference between the feedback signal and the reference signal. In this example, the phase-difference is determined by monitoring when the reference signal and feedback signal cross a threshold. This is or the purposes of example only and the phase-difference could be determined some other way. For example, the phase-difference could be determined by monitoring only the rising edges of the feedback and reference signals.

In the example of FIG. 8, the first current pulses commence at the point when one of the reference signal and feedback signal is detected to have crossed the threshold and terminate when the other of the reference signal and the feedback signal is detected to have crossed the threshold. The direction of the pulse is determined according to which of the signals crosses the threshold first. An "up" pulse is generated if the reference signal crosses the threshold before the feedback signal. A "down" pulse is generated if the feedback signal crosses the threshold before the reference signal.

The feedback signal 802 is formed by dividing the output signal by a divisor that varies between two or more integer values. Therefore, the phase-difference between the feedback signal and the reference signal will often not correctly represent the frequency of the output signal because the phase-difference incorporates an error due to the variation of the division ratio. The second current pulses 803 are intended to compensate for this error. The second current pulses are shown as being of fixed duration but having a value that varies in dependence on the phase-error. Each of the second pulses may start a fixed length of time after the VCO clock. The second pulses may also be "up" or "down" pulses, depending on whether the divisor is slightly too low (causing the feedback signal to lead more than it should) or slightly too high (causing the feedback signal to lag more than it should).

The second current pulses need not be of fixed duration, as shown in FIG. 8. Commonly, the second current pulses may have a duration that is equal to or a multiple of the period of the output signal. When the phase-locked loop is not locked, this period is likely to change with time as the frequency of the output signal is adjusted to become closer to the reference signal. Therefore, the second current pulses may be of predetermined, rather than fixed, duration.

The first and second pulses shown in FIG. 8 have different shapes, which could cause unacceptable transients being introduced into the loop filter. This can be understood by considering the situation when the phase-locked loop is in the locked condition, so that the output signal has a frequency that is the fixed multiple of the reference signal. In this situation any phase-difference between the feedback signal and the reference signal should be solely due to the variation of the division ratio. Therefore, assuming accurate compensation for this error, the current pulses generated in response to the phase-difference and phase-error should contain the same electric charge but in different directions. When integrated over time, these pulses would sum to zero. However, if the current pulses were introduced directly into the loop filter, the difference in their shapes means that at any given time instant the electrical charge introduced into the loop filter would be likely to be non-zero. This can cause large transients to be introduced into the loop filter.

The current pulses 805 represent the sum of the first and second current pulses. These pulses are output by the summation unit and are representative of what the phase-difference between the feedback signal and the reference signal would have been had the output signal been divided by the fixed multiple to form the feedback signal rather than by the varying divisor. Because the first and second pulses have been summed by the summation unit before outputting them to the loop filter, the problem of transients caused by temporal mismatch between the first and second current pulses may be reduced.

Specific examples of charge pumps including current generators and summation units for a phase-locked loop will now be described.

Figure 5A:
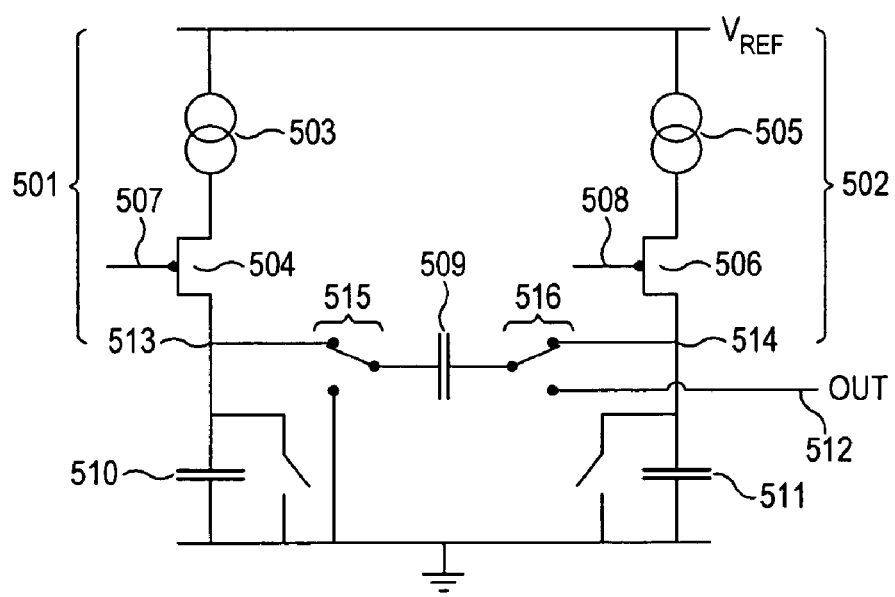
FIGS. 5a to 5c show charge pumps having two transistors of the same polarity.
Figure 5B:
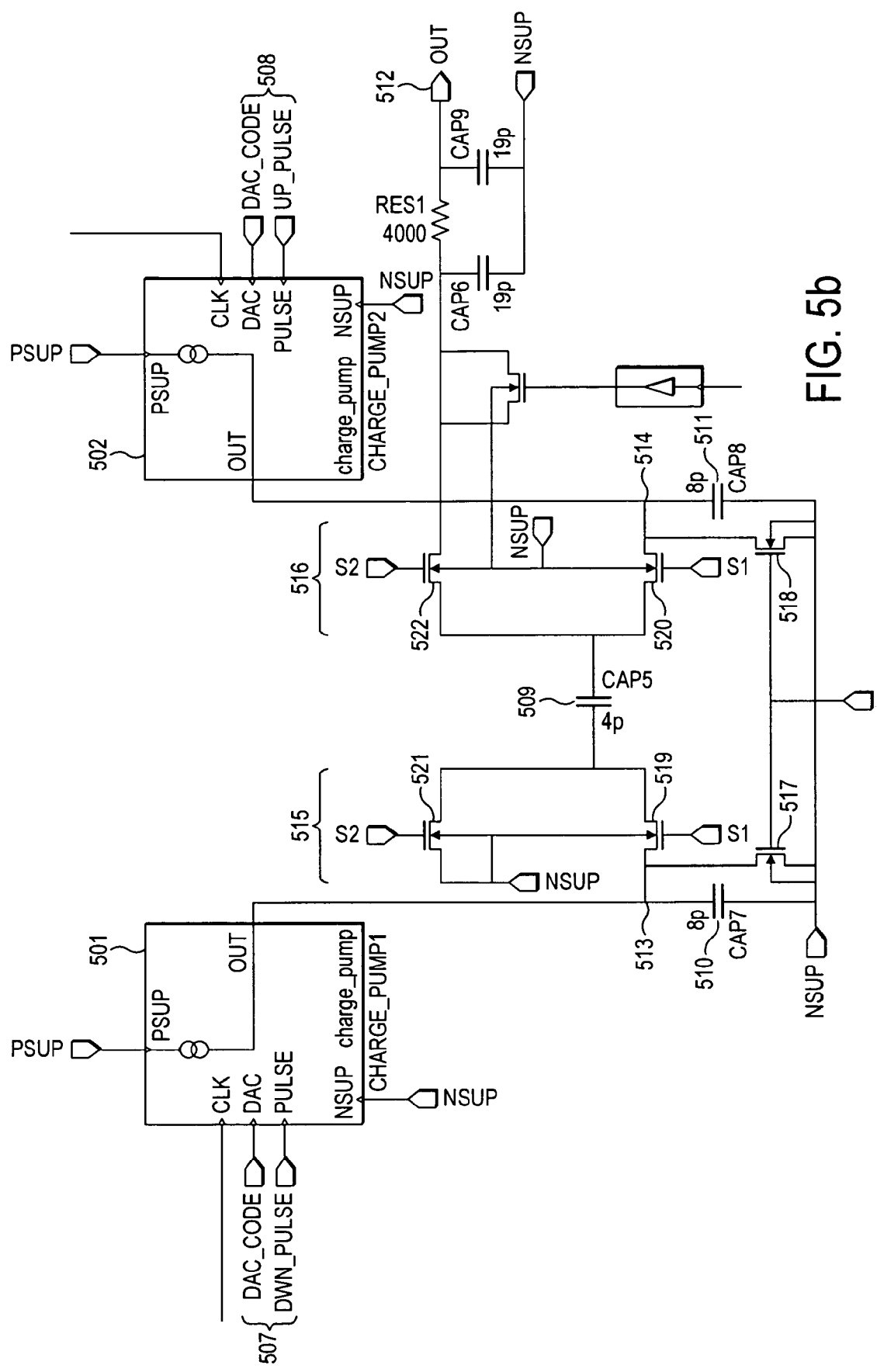

FIGS. 5a and 5b show examples of charge pumps that generates both "up" and "down" currents by means of transistors of the same polarity. The charge pump shown in FIG. 5b is a specific implementation of the circuit shown in FIG. 5a. The two circuits function in substantially the same way. In both figures the same references are used for components performing the same function in the charge pump.

In FIG. 5a, the charge pump comprises two current paths 501, 502. The first current path comprises current source 503 and current control device 504. The second current path comprises current source 505 and current control device 506. In FIG. 5 the current control devices are provided by PMOS transistors. The transistors are controlled by voltages applied to their respective control nodes 507, 508. The charge pump also comprises a capacitive element 509. The charge pump is shown during the first time period, so that the capacitive element has one plate communicating with the first current path and one plate communicating with the second current path. The currents output by each current path are received by capacitors 510, 511 and cause a voltage change at nodes 513, 514. This voltage change causes an electrical charge to form on the plates of the capacitor, which is transferred to the loop filter during the second time period by connecting one plate to circuit ground and the other plate to an output node 512. The charge pump comprises switching arrangements 515, 516 that control the connections of the capacitive element in the first and second time periods.

The capacitors 510, 511 are shown connected between the current paths and a reference voltage. However, the capacitors may be connected to different reference voltages. Similarly, both current sources 503, 505 are shown connected to the same reference voltage. However, the current sources may be connected to different reference voltages.

Figure 5C:
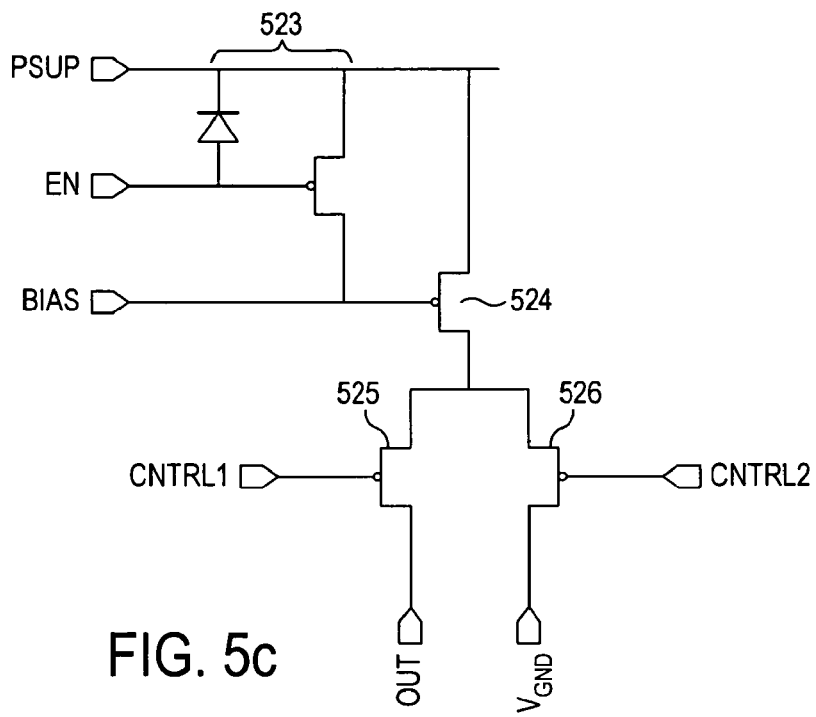

FIG. 5b shows an example of a specific implementation of the charge pump shown generally in FIG. 5a. The charge pump shown in FIG. 5b comprises two current paths 501, 502. Each current path includes a current source and a current control device as shown in FIG. 5c. In FIG. 5c, the current source is shown at 523 and the current control device is provided by PMOS transistor 524. Two further transistors 525, 526 act as switches so that a current output by the current source when transistor 524 is conducting can be connected either to the remainder of the charge pump or to virtual ground. The operation of transistors 525, 526 may be controlled by control signals generated by a control unit.

The charge pump of FIG. 5b also includes a capacitive element 509 and switching arrangements 515, 516, which in the circuit of FIG. 5b are implemented by transistors 519 to 522. Further transistors 517, 518 are provided for discharging capacitors 510, 511 during the second time period.

Figure 4:
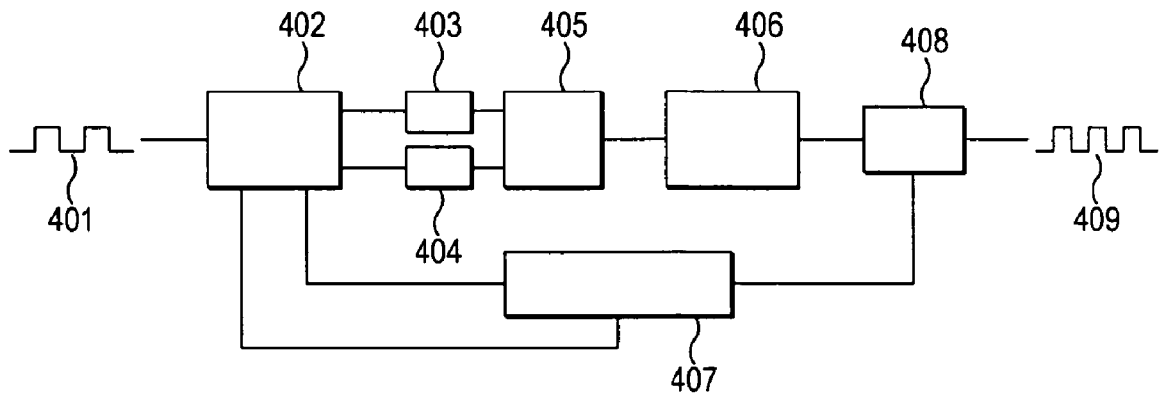
FIG. 4 shows a phase-locked loop incorporating a summation unit.

As in the circuit shown in FIG. 4, one objective of the circuits of FIGS. 5a and 5b is to provide a charge pump that can provide a current in two directions, i.e. a charge pump that can cause a current to flow either into or out of a circuit connected to the output node of the charge pump. In FIGS. 5a and 5b, current path 501 may be arranged to provide a "down"

current (i.e. a current flowing out of a circuit connected to the output node) while current path 502 can be arranged to provide an "up" current (i.e. a current flowing into a circuit connected to the output node of the charge pump). The arrangement of the charge pump shown in FIGS. 5a and 5b may be advantageous because the two different current directions can be achieved by means of current control devices of the same polarity (i.e. the PMOS transistors 503, 505). Therefore, the transient response of both transistors can be more closely matched than when transistors of different polarity are used.

The operation of both circuits is as follows:

During a first time period, the respective current sources of each current path may generate a current. The amount of charge that flows through each of the current paths during the first time period is dependent on the size of the current generated by each current source and the length of time for which that current is generated. These parameters are typically controlled by control inputs 507, 508.

The control signals input into the current sources during the first time period will typically be controlled so that a suitable amount of charge can be injected into a circuit connected to the output node of the charge pump. In a phase-locked loop, these control signals may be dependent on a phase difference between a feedback signal and a reference signal and/or on an error introduced into the system by modulating a division ratio. In FIG. 5b it can be seen that two control signals are input into each current source: DAC and pulse. The pulse input may control the current source in dependence on the phase difference between the feedback signal and the reference signal while the DAC input may be used to compensate for the modulated division ratio.

The pulse input may typically be used to cause the current source to generate a predetermined current for a length of time that is dependent on the phase difference between the feedback signal and the reference signal. The length of time may be proportional to the phase-difference between the reference signal and the feedback signal. The DAC input may typically be used to cause the current source to generate for a predetermined length of time a current that is dependent on a modulated division ratio. This predetermined length of time may be one period of the signal output by a phase-locked loop. The magnitude of the current may be proportional to the phase error. These two different types of compensation may lead to a two-stage current generation process, with e.g. phase compensation being performed first followed by DAC compensation. This will be described in more detail later.

The phase-locked loop may comprise a control unit for generating the control signals input into the current sources. This circuitry may be implemented wholly in hardware or may incorporate a processor running under software control.

The flow of current through each respective current path is controlled by the degree to which the transistors that control the flow of current in each current path are conducting between their drain and source terminals. This is determined by a control signal applied to the gate terminal of the transistors. In FIGS. 5a and 5b, both of the transistors are PMOS transistors and therefore both become conducting when a logic zero is applied to their gate terminal. Because both transistors are PMOS transistors, they may be controlled using the same control signal, e.g. by using an arrangement such as that shown in FIG. 5c. If the same control signal is used (and if both transistors have the same dimensions, doping levels etc) then both transistors should always be conducting to substantially the same extent. A charge pump that controls an output current by controlling the same polarity of transistor al may therefore offer significant noise advantages over charge pumps that use transistors of different polarities to control the current flow. If the same control signal is used for all of the current control devices, a current path from which a current is not wanted (e.g. the "up" path because only a "down" pulse is to be generated) can be diverted to virtual ground using a switching arrangement such as that shown in FIG. 5c.

The capacitor 509 is connectable to the current paths via switching arrangements 515 and 516. The switching arrangements shown in FIG. 5b each comprise two transistors acting as voltage-controlled switches so that the capacitor is alternately connectable to either the two current paths or to the output node of the charge pump. Each of the transistors in the switching arrangement is controlled by a respective control signal. As shown in FIG. 5b, each switching arrangement includes one NMOS transistor controlled by signal S1 and another NMOS transistor controlled by signal S2.

During the first time period, S1 is high while S2 is low so that transistors 519 and 520 are conducting while transistors 521 and 522 are non-conducting. Therefore, during the first time period, each plate of the capacitor is connected to a respective one of the current paths. If one or both of these paths is carrying a current during the first time period, this current causes an electrical charge to form on the plate of the capacitor connected to that path.

During the second time period, S2 is high while S1 is low so that transistors 519 and 520 are non-conducting while PMOS transistors 521 and 522 are conducting. Therefore, during the second time period the capacitor is isolated from the two current paths. During the second time period, one plate of the capacitor may be connected to a reference voltage via transistor 521 while the other plate of the capacitor is connected to the output node 512 of the charge pump via transistor 522. Therefore, the electrical charge that has accumulated on the plates of the capacitor during the first time period is transferred to the loop filter during the second time period. This causes a current to be generated at the output of the charge pump.

During the second time period, electrical charge built-up during the first time period on one of the capacitor's plates will tend to discharge in the opposite direction from electrical charge built-up on the other plate. Therefore, because current flowing through one of the current paths causes an electrical charge to build up on a different plate of the capacitor from current flowing in the same direction through the other current path, one path (502) is effectively capable of causing a current to flow into the output node while the other path (501) is effectively capable of causing a current to flow out of the output node.

A current may flow through only one of the two current paths during the first time period. Typically both transistors will be conducting if the arrangement of FIG. 5c is used (since both receive the same control signal) so that whether or not a current is output by a particular current path is controlled by the switching arrangement provided by transistors 525, 526. Alternatively both current paths may have a current flowing through them during the first time period (which again may be controlled by the switching arrangement provided by transistors 525, 526), causing an electrical charge to be built-up on both of the capacitor plates. During the second time period, these charges effectively discharge in opposite directions, so that the current output by the charge pump is representative of the difference between the currents that flowed through the first and second current paths during the first time period.

As mentioned above, the charge pump may perform both DAC and PFD compensation, in which case the charge pump may suitably be arranged to perform a two-part compensation process during the first time period. The DAC and PFD compensation may be performed consecutively or may overlap in time. For example, the PFD compensation may be start first to account for any phase difference between the feedback signal and the reference signal, followed by the DAC compensation to compensate for any errors caused by modulating the division ratio. The DAC compensation may always commence a predetermined time after the VCO clock. Depending on the duration of the PFD compensation pulse, the DAC compensation may commence before the PFD compensation has completed. This overlap may require each current path to have more than one current source (see later). Electrical charge accumulates on the capacitor plates during the two-part compensation process such that, at the end of the process, the electrical charge on each plate is the sum of the charges formed on that plate during both parts of the process. Therefore, the current output by the charge pump during the second time period will be representative of both the DAC and PFD compensation.

The circuits of FIGS. 5a and 5b therefore provide a charge pump that is able to provide an output current in two directions by means of transistors of the same polarity. Therefore, these circuits do not suffer from the problem of conventional charge pumps of not being able to match the transient behaviour of NMOS and PMOS transistors.

A further advantage of the circuit shown in FIGS. 5a and 5b is that when both DAC and PFD compensation are performed, only the difference between the two currents is transferred to the output node and hence to the loop filter of the phase-locked loop. This is advantageous because the PFD compensation is typically performed by generating a current pulse of predetermined size but variable length while the DAC compensation is typically performed by generating a current pulse of predetermined length but variable size. Therefore, although the error between the two signals averages to zero, the difference between the current pulse shapes for the two types of compensation can tend to create instantaneous noise in the phase-locked loop. Transferring a current that is dependent on the difference between the total charge generated during the PFD and DAC compensation phases reduces noise caused by temporal mismatch in the current pulses generated by the DAC and PFD compensation units.

One potential problem with the circuit shown in FIGS. 5a and 5b is that the parasitic capacitance of capacitor 509 can cause noise. A circuit that may address this problem is shown in FIG. 6a.

Figure 6A:
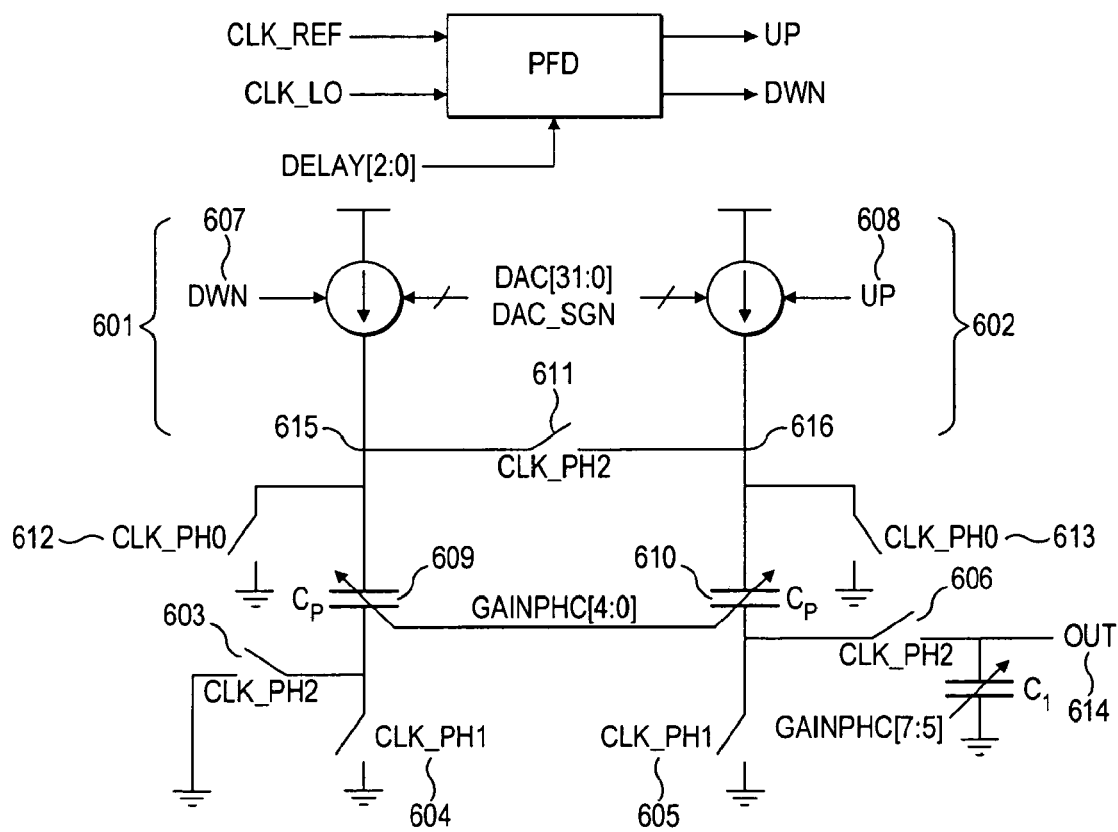
FIGS. 6a and 6b show charge pumps having improved performance.
Figure 6B:
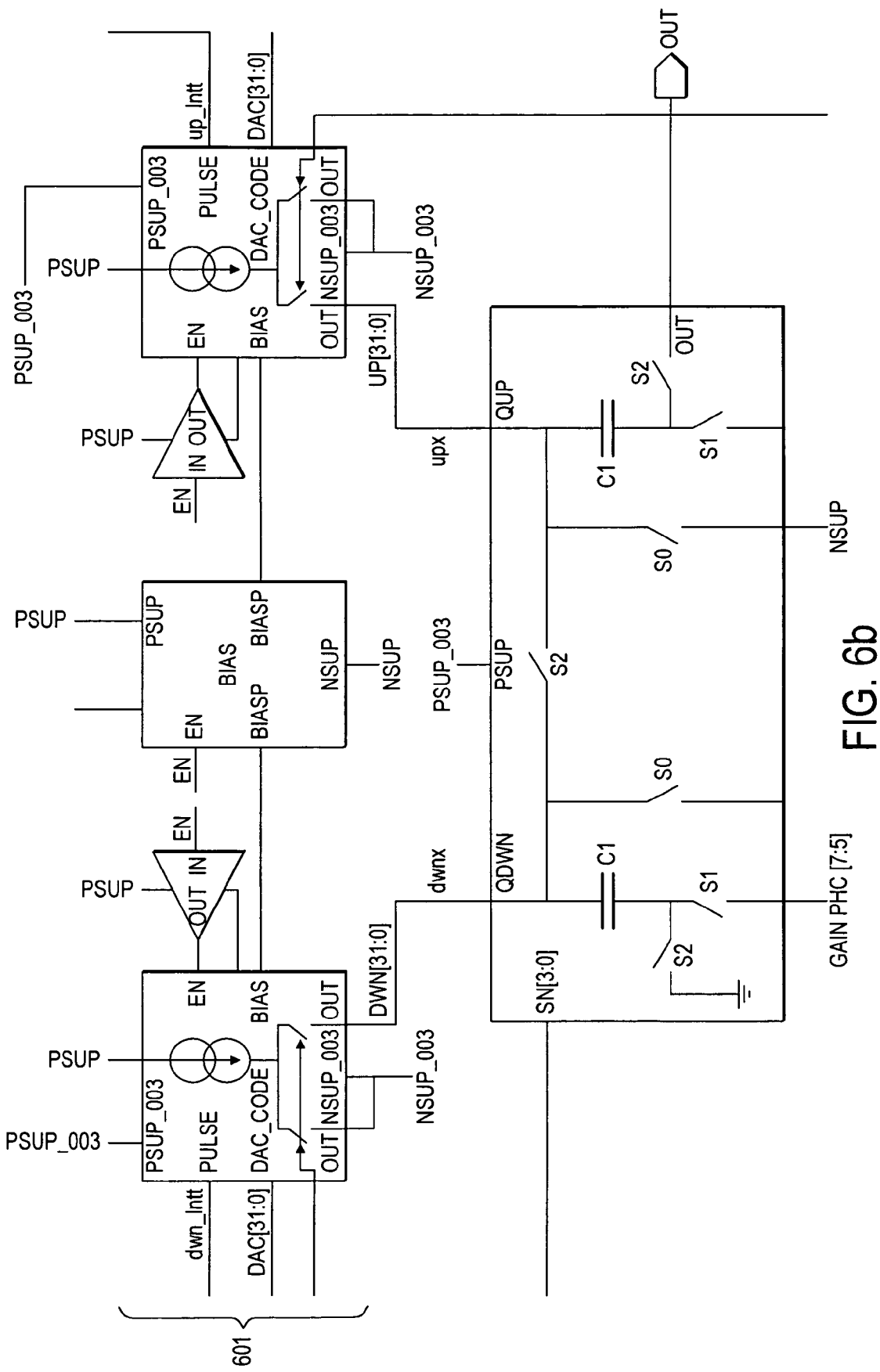

FIGS. 6a and 6b also show examples of charge pumps that generates both "up" and "down" currents by means of transistors of the same polarity. The charge pump shown in FIG. 6b is a specific implementation of the circuit shown in FIG. 6a. The two circuits function in substantially the same way. In both figures the same references are used for components performing the same function in the charge pump.

In FIG. 6a, the charge pump comprises two current paths 601, 602. Each current path may comprise a current source and current control device. The current control devices may be provided by PMOS transistors. The current paths are controlled by voltages applied to their respective control nodes 607, 608. The charge pump also comprises a capacitive element provided by capacitors 609 and 610. During the first time period, the capacitive element has one plate in capacitor 609 communicating with the first current path and one plate in capacitor 610 communicating with the second current path. Switches 604 and 605 are closed so that the currents output by each current path are received by capacitors 609, 610 and cause an electrical charge to build up across the capacitors. This electrical charge is discharged during the second time period by connecting both capacitors together via switch 611 to effectively form a single capacitor with one plate connected to circuit ground via switch 603 and the other plate connected to an output node 614 via switch 606. The capacitors may be briefly reset via switches 612, 613 after they have been discharged into the output node to ensure that they are completely discharged before a new charging process is begun.

FIG. 6b shows a specific implementation of a circuit that functions in substantially the same way as the circuit shown in FIG. 6a. The circuit of FIG. 6b also comprises two current paths, each having a current source and a current control device. These may be arranged in a simple series arrangement such as that shown in FIG. 5a or in a more complex arrangement such as that shown in FIG. 5c.

The circuits of FIGS. 6a and 6b differ from that of FIGS. 5a and 5b in that a capacitor is connected to each current path. The operation of the circuits in FIGS. 6a and 6b is similar to that of the circuits in FIGS. 5a and 5b, in that during a first time period a current flowing through the current paths causes an electrical charge to form on one or more capacitive plates, the electrical charge then being discharged during a second time period. However, the principle of operation is slightly different. In the circuits of FIGS. 5a and 5b, a current output by one of the current paths causes a voltage drop at the node to which the capacitor is connected, thereby causing an electrical charge to form on the plate of the capacitor. In the circuit of FIGS. 6a and 6b, a current output by one of the current paths flows through one of the capacitors and thereby causes an electrical charge to build-up on the plates of that capacitor.

The switching sequence for the circuit of FIG. 6b is as follows. First, switches S2 are open and switches S1 and S0 are closed so that any residual charge stored on capacitors C1 can be discharged. Then switches S0 and S2 are open and switches S1 are closed, so that current can flow through the first and second current paths and cause an electrical charge to form on the plates of the capacitors. Finally, switches S0 and S1 are open and switches S2 are closed. The two capacitors are thus connected together with a first plate of the complete capacitive element being connected to a reference voltage (circuit ground in the figure) and a second plate of the capacitive element being connected to the output node of the charge pump.

Each of switches S0, S1 and S2 in FIG. 6 may be implemented by transistors.

The circuits of FIGS. 6a and 6b therefore provide similar advantages to the circuits of FIGS. 5a and 5b but offers improved performance. One advantage is that the arrangement of the capacitive element in the circuits of FIGS. 6a and 6b suffers less from parasitic capacitance than the circuits of FIGS. 5a and 5b. Therefore, this capacitive arrangement may be advantageous from a noise perspective. Another advantage is that the circuits of FIGS. 6a and 6b provide a higher dynamic range than the circuits of FIGS. 5a and 5b. A further advantage is that the circuits of FIGS. 6a and 6b have a lower on-chip capacitance than the circuits of FIGS. 5a and 5b.

A further advantage of the circuits shown in FIGS. 6a and 6b is that the voltage swings at the nodes 615 and 616 are relatively small, which means that the current sources can be made very linear.

The current control devices described herein are not limited to transistors but may be any type of current control device having a polarity that affects its behaviour. Similarly, although the transistors referred to herein have mainly been PMOS transistors, this is for the purposes of example only and any type or polarity of transistor may be used. However, PMOS transistors may offer noise benefits over other types of transistor.

The current paths shown in FIGS. 5a, 5b, 6a and 6b may comprise a plurality of individual current branches, each comprising a current source and a current control device. The current output by a current path may be the sum of the currents generated by the plurality of current branches belonging to that path. An example of such a circuit is shown in FIG. 7.

Figure 7:
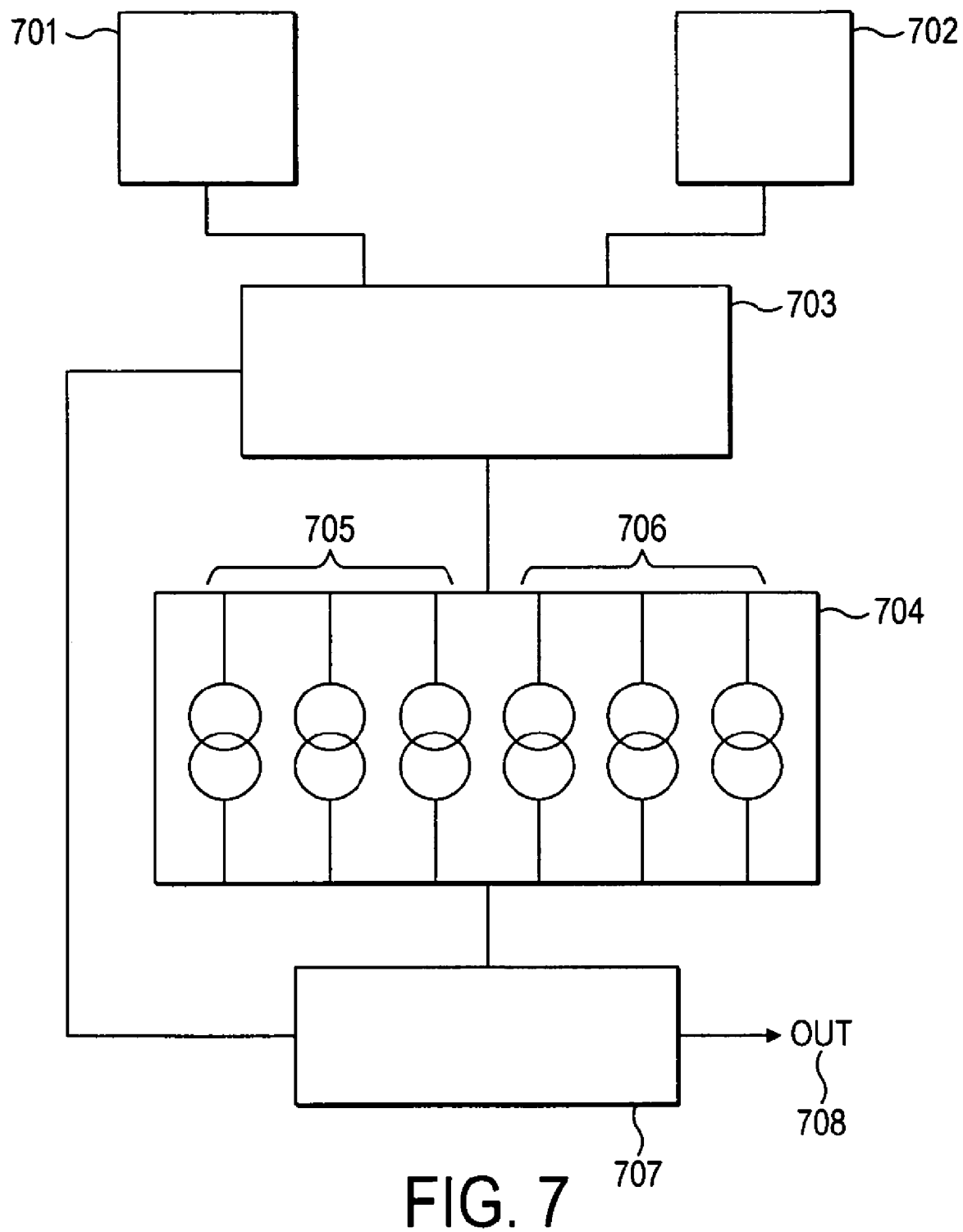
FIG. 7 shows a charge pump having a plurality of current sources.

FIG. 7 shows a control unit 703 that is arranged to receive input signals from first and second comparison units 701, 702. The first comparison unit may suitably be a phase-frequency detector that is arranged to detect a phase difference between the reference signal and the feedback signal of a phase-locked loop. The second comparison unit may suitably be arranged to generate a control signal for the control unit in dependence on the modulation of the division ratio in the feedback loop of a phase-locked loop. The second comparison unit may also incorporate a phase-frequency detector (which may be the phase-frequency detector of the first comparison unit) to enable it to determine the current required to compensate for the modulation of the division ratio. The control unit controls the operation of a group of current branches 704 in dependence on the signals received from the comparison units. Each current branch may comprise a current source and a current control device as shown in FIGS. 5a and 6a or FIG. 5c. The control unit can then control a current output by each of the current branches by controlling the voltage at the control node of the current control device in each branch.

The current branches generate a current in dependence on control signals received from the control unit. If the current branches are arranged as shown in FIG. 5c, the same control signal may be used to provide the control voltage for all of the current control devices. The sum of the currents generated by the current sources is received by a summation unit 707, which may suitably be a capacitive element. The summation unit generates the output signal 708, which may be for injecting charge into a loop filter of a phase-locked loop.

The control unit may control the current sources to generate the required currents during a first time period. During this first time period, the currents generated by the individual current sources are received by the summation unit. During the second time period, the summation unit forms an output current that is dependent on the currents it received during the first time period. It can be seen that this corresponds to the first and second time periods that were described with reference to FIGS. 5a, 5b, 6a and 6b.

By comparing FIG. 7 with FIGS. 5a, 5b, 6a and 6b, it can be seen that the summation unit may be provided by the capacitive arrangements shown in FIGS. 5a, 5b, 6a and 6b. The current paths shown in FIGS. 5 and 6 can be considered to represent a plurality of current branches arranged in parallel, so that each of the capacitive plates may be in communication a plurality of current branches during the first time period.

The current branches may be arranged into two groups 705, 706. A first group 705 may be arranged to generate "up" current pulses. A second group 706 may be arranged to generate "down" current pulses. Often PFD and DAC compensation requires that current pulses be generated in opposite directions, particularly in the locked condition when theoretically the phase-difference between the reference and feedback signals is equal to the phase error caused by modulating the division ratio. Therefore, it will frequently occur that one group of current sources will used to generate the current pulses for PFD compensation followed by the other group of current sources generating pulses for DAC compensation.

The control unit may be arranged to alter the current sources it uses for PFD compensation and DAC compensation from one time period to the next so that the current sources are rotated, either individually or in a block, between the first and second groups. This rotation helps to reduce noise because it enables any errors in the PFD or DAC compensation caused by individual ones of the current sources to be evened out over time.

The control unit may be arranged to control the current branches such that a two-part compensation process is performed. PFD compensation and DAC compensation may be performed separately (e.g. consecutively). However, the two parts of the process may overlap in time. The first group of current sources may first be controlled to generate a current dependent on the signal received from the first comparison unit. A predetermined time after the VCO clock, the second group of current sources may be controlled to generate a current in dependence on the signal received from the second comparison unit. If the first group of current sources is still generating current as the second group of current sources starts to generate current, the two currents will be received concurrently by the summation unit. These two current generation processes may be non-overlapping in time. However, it may be that two forms of compensation can overlap in time even when the same charge pump is used provided that different current branches are used for each form of compensation.

Typically, PFD compensation may be performed by generating current pulses of predetermined value but variable duration. Therefore, the control unit may be arranged to perform PFD compensation by controlling a predetermined or fixed number of the current sources (e.g. all of the current sources in the first or second group) to generate a current for a length of time that is dependent on the signal received from the phase-frequency detector.

Commonly, when the feedback signal lags the reference signal it is necessary to inject charge into the loop filter of the phase-locked loop and when the feedback signal leads the reference signal it is necessary to remove charge from the loop filter. This can be achieved by generating an output current that flows either into or out of the node connected to the charge pump. If the summation unit is provided by a capacitive arrangement similar to those shown in FIGS. 5a, 5b, 6a and 6b, the required currents can be generated by causing current to flow through either the first current path or the second current path. Therefore, if the feedback signal lags the reference signal, the control unit may cause the current branches of the second current path to generate a current during the first time period so that a current flows out of the output node and into the loop filter during the second time period. Similarly, if the feedback signal leads the reference signal, the control unit may cause the current branches of the second current path to generate a current during the first time period so that a current flows into the output node and out of the loop filter during the second time period.

Typically, DAC compensation may be performed by generating current pulses of predetermined or fixed duration but variable value. Therefore, the control unit may be arranged to perform DAC compensation by controlling a number of current sources to generate current for a predetermined or fixed length of time. The predetermined length of time may be one period of the VCO output signal. The number of current sources arranged to generate a current may be dependent on the signal received from the DAC compensation unit. A variable current may also be achieved by the control unit controlling current control devices in the summation unit, e.g. by setting the control voltage applied to the gate terminals of transistors 503 and 505 in FIG. 5a and transistors 603 and 605 in FIG. 6a.

In a similar way to PFD compensation, DAC compensation can require charge to be either injected or removed from the loop filter. This is dependent on the direction of the phase error. When the phase error is in a positive direction, it is generally necessary to inject charge into the loop filter. This is because a positive phase error will either cause a feedback signal lagging the reference signal to appear to lag less than it should, so that not enough charge would be injected into the loop filter by PFD compensation alone, or cause a feedback signal leading the reference signal to appear to lead more than it should, so that too much charge would be removed from the loop filter by PFD compensation alone. A positive phase error is therefore compensated for by injecting charge proportional to the error into the loop filter. This may be achieved by having the second current path outputting a current rather than the first current path. Similarly, a phase error in the negative direction requires charge to be removed from the loop filter. This may be achieved by having the first current path outputting a current rather than the second current path. When the phase-locked loop is locked, the phase error should be equal in magnitude but opposite direction to the phase-difference between the reference signal and the feedback signal.

In one embodiment, the control unit may comprise a demultiplexor for controlling the DAC current branches. A DAC code received by the control means, or generated by the control means from information received from the divider, may be input into the demultiplexor to activate the required number of current branches for a predetermined length of time. The activated branches may be those which are connected to the rest of the charge pump, with the unactivated current branches outputting their current to virtual ground. The control unit may also comprise control lines for activating the PFD current branches for a length of time dependent on the length of time for which an output of the phase-frequency detector has a predetermined logic level. The control unit may also comprise a switching arrangement for "rotating" the current branches between the DAC and PFD groups at each clock period.

A current source may be used either for PFD compensation or for DAC compensation. The number of current sources used for each type of compensation may be the same or may be different. The current sources may be physically arranged in an interleaved way such that, in an arrangement of parallel current sources, each alternate current source is used for PFD compensation with the other current sources being used for DAC compensation (i.e. a parallel arrangement: A B A B . . . ; with "A" current sources being used for PFD compensation and "B" current sources being used for DAC compensation).

The overall current that is output by the charge pump may be directly representative of an overall error in the output signal of the phase-locked loop relative to the reference signal. This is because the phase-locked loop described herein is not arranged to form an output signal having a fixed, permanent phase offset relative to the reference signal. Some phase-locked loops are designed to form an output signal having such a fixed phase offset between the output signal and the reference signal because it enables the phase-error compensation to be always performed in one direction. For example, if a sufficient offset is applied to the output signal then the feedback signal can be made to always lead or lag the reference signal, such that phase-error compensation always involves current pulses either in the "up" direction or in the "down" direction. However, in the charge pump described herein, DAC compensation is performed by generating current pulses in either the "up" or the "down" direction, depending on the direction of the phase-error, so that no such phase offset is required.

The phase-locked loop may be arranged to generate an output signal having a frequency that is a static value times the frequency of the reference signal. However, this static value may be achieved on average by varying the division ratio. The charge provided by the overall current pulse that is output by the charge pump may be proportional to the phase-difference that would have existed between the reference signal and the feedback signal if the feedback signal had been formed by dividing the output signal by the static value and not by the varied divider. Thus, if there were no phase difference between the reference signal and the feedback signal, because the feedback signal contained no error due to the variation of the divisor and the output signal had the correct frequency, the overall current pulse would contain no charge.

The charge pump described above may therefore offer noise advantages over existing charge pumps. The charge pump is also capable of performing both DAC and PFD compensation so that a phase-locked loop need not contain two charge pumps. In addition, both DAC and PFD compensation can be performed using the same transistors as current control devices. Therefore, noise is not incurred by using different transistors, which would inevitably behave slightly differently, for PFD compensation and DAC compensation.

It should be understood that the circuits described and illustrated herein are examples only and the invention is not limited to any specific implementation of charge pump or phase-locked loop.

The applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present invention may consist of any such feature or combination of features. In view of the foregoing description it will be evident to a person skilled in the art that various modifications may be made within the scope of the invention.

The invention claimed is:

1. A phase-locked loop arranged to generate an output signal having a first frequency that is a static value times the frequency of a reference signal, the phase-locked loop comprising
 a signal generator arranged to generate the output signal,
 a divider arranged to receive the output signal and divide the output signal to form a feedback signal, the divider being arranged to vary the divisor by which the output signal is divided to cause the output signal to have a frequency that is said static value times the frequency of the reference signal,
 a comparison unit arranged to compare the feedback signal with the reference signal,
 one or more current generators arranged to output current pulses in dependence on said comparison,
 a summation unit arranged to receive the current pulses output by the current generator(s) and form a single current pulse therefrom and
 a loop filter arranged to filter the single current pulse to form a control signal for controlling the signal generator, the phase-locked loop being arranged such that:
 during the first time period, the current generator(s) generate(s) a first current pulse dependent on a phase-difference between the feedback signal and the reference signal and a second current pulse dependent on an error in the feedback signal that is caused by the variation of the divisor, and the summation unit receives the first and second current pulses and stores an electrical charge representative of those current pulses; and during a second time period that does not overlap with the first time period, the summation unit causes the single current pulse to flow either into or out of the loop filter in dependence on the first and second current pulses;

the summation unit comprising:

two current paths, the first current path being for generating a current in one direction at an input node of the loop filter and the second current path being for generating a current in the opposite direction at the input node of the loop filter;

a capacitive element having first and second capacitive plates; and a switching arrangement arranged such that, during a first time period, the first and second capacitive plates are each in communication with a respective one of the current paths, whereby a current output by the first current path causes an electrical charge to be formed on the first capacitive plate and a current output by the second current path causes an electrical charge to be formed on the second capacitive plate, and during a second time period, the first and second capacitive plates are connected to a reference voltage and the input node of the loop filter respectively, the electrical charge formed on the first and second capacitive plates during the first time period thereby being discharged to form the single current pulse, said single current pulse being representative of a phase-difference that would have existed between the reference signal and the feedback signal if the feedback signal had been formed by dividing the output signal by said static value and not by the varied divisor.

2. A phase-locked loop as claimed in claim 1, wherein the phase-locked loop is arranged such that the current generator (s) generates the first current pulse to have a fixed value and a duration that is dependent on the phase-difference between the feedback signal and the reference signal.

3. A phase-locked loop as claimed in claim 1, wherein the phase-locked loop is arranged such that the current generator (s) generates the second current pulse to have a predetermined duration and a value that is dependent on the error in the feedback signal caused by the variation of the divisor.

4. A phase-locked loop as claimed in claim 1, wherein the summation unit is arranged to form the single current pulse by discharging the electrical charge stored by the summation unit.

5. A phase-locked loop as claimed in claim 1, wherein the summation unit comprises a capacitive element arranged to store an electrical charge representative of the magnitude and duration of the first current pulse.

6. A phase-locked loop as claimed in claim 1, wherein the summation unit comprises a capacitive element arranged to store an electrical charge representative of the magnitude and duration of the second current pulse.

7. A phase-locked loop as claimed in claim 1, wherein the capacitive element is arranged such that the electrical charge formed on the first capacitive plate discharges in one direction relative to the input node of the loop filter and the electrical charge formed on the second capacitive plate discharges in the opposite direction relative to the input node of the loop filter.

8. A phase-locked loop as claimed in claim 1, wherein the capacitive element is connected between the first and second current paths such that, during the first time period, a current output by the first current path causes a voltage change at the other of the switched nodes of the current control device of the first path that causes an electrical charge to form on the first capacitive plate and a current output by the second current path causes a voltage change at the other of the switched nodes of the current control device of the second path that causes an electrical charge to form on the second capacitive plate.

9. A phase-locked loop as claimed in claim 8, wherein the capacitive element is a capacitor arranged such that, during the first time period, one plate of the capacitor is connected to the first current path and the other plate of the capacitor is connected to the second current path.

10. A phase-locked loop as claimed in claim 1, wherein the capacitive element comprises two capacitive devices, one connected to the first current path and the other connected to the second current path such that, when a current is output by one of the current paths, it is received by the capacitive device connected to that current path and causes an electrical charge to form on a plate of that device.

11. A phase-locked loop as claimed in claim 10, wherein the capacitive element comprises a switch arranged such that, during the first time period, the capacitive devices are not connected to each other and, during the second time period, the capacitive devices are connected to each other.

12. A phase-locked loop as claimed in claim 10, wherein the capacitive devices are capacitors.

13. A phase-locked loop as claimed in claim 1, wherein the static value is a non-integer.

14. A phase-locked loop as claimed in claim 1, wherein the single pulse provides a charge that is a function of the phase-difference that would have existed between the reference signal and the feedback signal if the feedback signal had been formed by dividing the output signal by said static value and not by the varied divisor.

15. A phase-locked loop as claimed in claim 1, wherein the signal current pulse provides a charge that is proportional to the phase-difference that would have existed between the reference signal and the feedback signal if the feedback signal had been formed by dividing the output signal by said static value and not by the varied divisor.

* * * * *